United States Patent
Tsai et al.

(10) Patent No.: US 10,411,646 B2
(45) Date of Patent: Sep. 10, 2019

(54) INSPECTION METHOD AND INSPECTION SYSTEM OF SOLAR CELL

(71) Applicant: CHROMA ATE INC., Tao-Yuan (TW)

(72) Inventors: Cheng-Ting Tsai, Tao-Yuan (TW); Lan-Sheng Yang, Tao-Yuan (TW)

(73) Assignee: CHROMA ATE INC., Tao-Yuan (TW)

( * ) Notice: Subject to any disclaimer, the term of this patent is extended or adjusted under 35 U.S.C. 154(b) by 0 days.

(21) Appl. No.: 16/013,917

(22) Filed: Jun. 20, 2018

(65) Prior Publication Data

US 2018/0375470 A1    Dec. 27, 2018

(30) Foreign Application Priority Data

Jun. 21, 2017    (TW) .............................. 106120762 A

(51) Int. Cl.
| | | |
|---|---|---|
| *H02S 50/10* | (2014.01) | |
| *G02B 27/30* | (2006.01) | |
| *H01L 31/048* | (2014.01) | |
| *H01L 31/0224* | (2006.01) | |
| *H02S 50/15* | (2014.01) | |

(52) U.S. Cl.
CPC .............. *H02S 50/10* (2014.12); *G02B 27/30* (2013.01); *H01L 31/022425* (2013.01); *H01L 31/048* (2013.01); *H02S 50/15* (2014.12)

(58) Field of Classification Search
CPC ......... H02S 50/15; H02S 50/10; G02B 27/30; H01L 31/022425; H01L 31/048
See application file for complete search history.

(56) References Cited

U.S. PATENT DOCUMENTS

| | | | | |
|---|---|---|---|---|
| 4,777,360 A | * | 10/1988 | Carner, Jr. ............... | G01D 5/26 250/206.1 |
| 6,671,349 B1 | * | 12/2003 | Griffith .................... | A61B 6/12 356/139.1 |
| 6,717,662 B2 | * | 4/2004 | Lange ..................... | G01S 3/781 250/237 R |
| 7,295,329 B2 | * | 11/2007 | Gruhlke ................ | G06F 3/0421 250/221 |
| 2002/0018118 A1 | * | 2/2002 | Coulombe ........... | G06K 9/2036 348/43 |
| 2005/0135670 A1 | * | 6/2005 | Vaidyanathan ......... | G06T 17/10 382/154 |

(Continued)

FOREIGN PATENT DOCUMENTS

| | | |
|---|---|---|
| CN | 1531648 A | 9/2004 |
| CN | 101454905 A | 6/2009 |

(Continued)

*Primary Examiner* — Sang H Nguyen
(74) *Attorney, Agent, or Firm* — CKC & Partners Co., LLC

(57) ABSTRACT

A method for inspecting a solar cell and configured to inspect a peeling state of a three-dimensional pattern of the solar cell includes obliquely illuminating the three-dimensional pattern of the solar cell using a light beam. An image of the solar cell is normally captured. An intensity of the light beam is increased to increase a contrast between the three-dimensional pattern and a shadow of the three-dimensional pattern in the image and increase a contrast between an ink pattern of the solar cell and the shadow in the image to overexpose the ink pattern in the image. Determine if the three-dimensional pattern is peeling according to the shadow of the three-dimensional pattern in the image.

4 Claims, 7 Drawing Sheets

(56) References Cited

U.S. PATENT DOCUMENTS

2011/0228082 A1* 9/2011 Wen .................. G01B 11/2518
348/139
2015/0268537 A1* 9/2015 Kinebuchi ........... G03B 21/142
353/97

FOREIGN PATENT DOCUMENTS

| JP | 2014132230 A | 7/2014 |
| TW | 201144747 A | 12/2011 |
| TW | M536823 U | 2/2017 |
| WO | 2009084702 A1 | 7/2009 |

* cited by examiner

INSPECTION METHOD AND INSPECTION SYSTEM OF SOLAR CELL

RELATED APPLICATIONS

This application claims priority to Taiwan Application Serial Number 106120762, filed Jun. 21, 2017, which is herein incorporated by reference.

BACKGROUND

Field of Disclosure

The present disclosure relates to an inspection method. More particularly, the present disclosure relates to a method for inspecting the peeling of a three-dimensional pattern of a solar cell.

Description of Related Art

A solar cell includes a semiconductor substrate and electrodes. The electrodes are configured to connect the electrical energy generated by the optical absorption of the semiconductor substrate to an outer electric circuit. The electrodes may be formed by printing conductive ink on the semiconductor substrate. The electrodes may peel from the semiconductor substrate during the manufacturing process of the solar cell if the conductive ink has bad adhesion with the semiconductor substrate. Therefore, many in the industry are striving to provide a method for quickly and precisely inspecting the peeling of the electrodes.

SUMMARY

According to some embodiments, a method for inspecting a solar cell and configured to inspect a peeling of a three-dimensional pattern of the solar cell includes obliquely illuminating the three-dimensional pattern of the solar cell using a light beam. An image of the solar cell is normally captured. An intensity of the light beam is increased to increase a contrast between the three-dimensional pattern and a shadow of the three-dimensional pattern in the image and increase a contrast between an ink pattern of the solar cell and the shadow in the image to overexpose the ink pattern in the image. Determine if the three-dimensional pattern is peeling according to the shadow of the three-dimensional pattern in the image.

According to some other embodiments, an inspection system of a solar cell includes a light source, a capturing device, and an analyzing module. The light source is configured to provide a light beam to obliquely illuminate an inspecting surface. The capturing device is configured to normally capture an image of the solar cell on the inspecting surface. The analyzing module is electrically connected to the capturing device. The analyzing module is configured to increase a contrast between a three-dimensional pattern of the solar cell and a shadow of the three-dimensional pattern in the image, increase a contrast between an ink pattern of the solar cell and the shadow in the image to overexpose the ink pattern in the image, and determine if the three-dimensional pattern of the solar cell is peeling according to the shadow of the three-dimensional pattern in the image.

DETAILED DESCRIPTION

Figure 1:
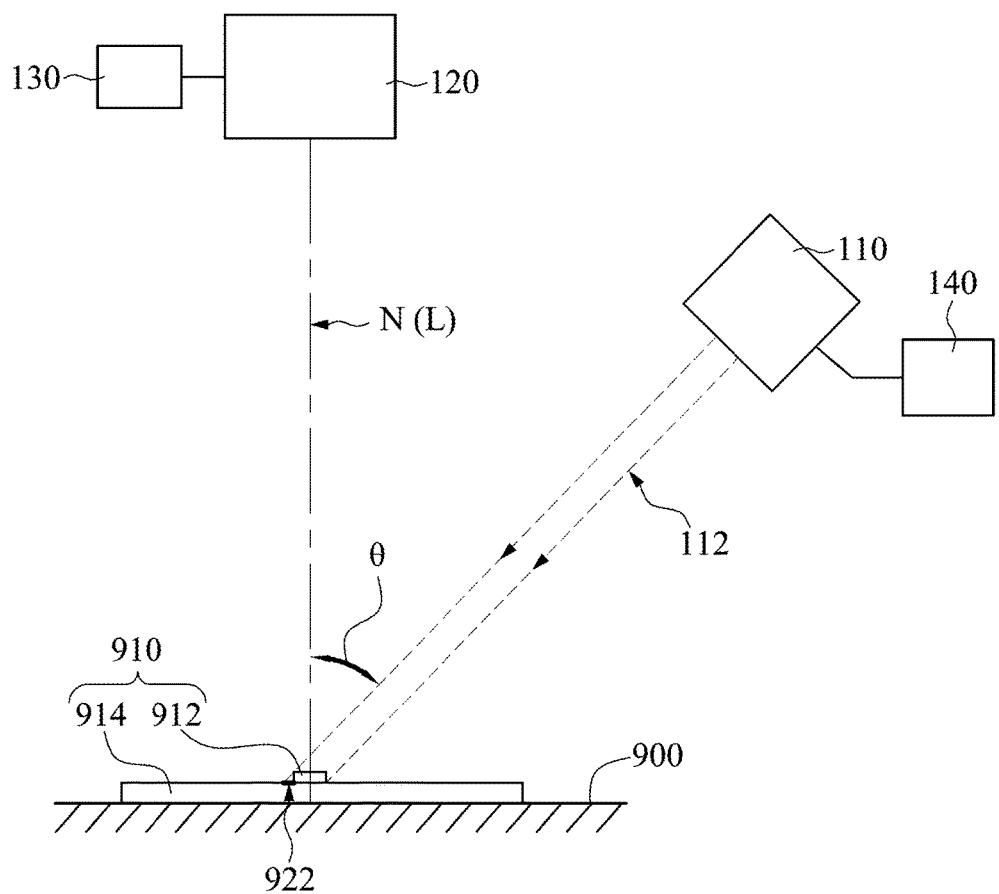
FIG. 1 is an illustrative diagram of an inspection system according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is an illustrative diagram of an inspection system 100 according to one embodiment of the present disclosure. The inspection system 100 includes a light source 110, a capturing device 120, and an analyzing module 130. The light source 110 is configured to provide a light beam 112 to obliquely illuminate an inspecting surface 900. The capturing device 120 is configured to normally capture an image of the solar cell 910 on the inspecting surface 900. The analyzing module 130 is electrically connected to the capturing device 120. The analyzing module 130 is configured to determine if a three-dimensional pattern 912 is peeling according to a shadow 922 of the three-dimensional pattern 912 of the solar cell 910 in the image.

The inspecting surface 900 has a normal line N. The term "a light beam 112 . . . obliquely illuminates an inspecting surface 900" as used herein means the light beam 112 is not parallel to the normal line N of the inspecting surface 900. Or, the light beam 112 and the normal line N of the inspecting surface 900 form an angle θ which is greater than 5 degrees and smaller than 90 degrees. In some embodiments, the angle θ may be about 9 degrees. Moreover, the term "the capturing device 120 is configured to normally capture an image of the solar cell 910 on the inspecting surface 900" as used herein means an optical light path L of the capturing device 120 for receiving the light is perpendicular or nearly perpendicular to the inspecting surface 900, as shown in FIG. 1. Or, the light path L and the normal line N of the inspecting surface 900 form an angle small than 30 degrees.

In the present embodiments, the three-dimensional pattern 912 of the solar cell 910 can be an electrode of the solar cell 910. Specifically, the solar cell 910 may include a substrate 914 and the electrode formed on the substrate 914. The electrode is configured to output the electrical energy generated by the substrate 914. It is noted that although in this embodiments, the three-dimensional pattern 912 is the electrode, in other embodiments, the three-dimensional pattern 912 can be a structure protruded from the substrate 914, such as a wire or a three-dimensional defect, and the present disclosure is not limited in this respect.

In this embodiment, the electrodes of the solar cell 910 can be formed on the substrate 914 by performing a printing process or other suitable processes. However, some electrodes may peel from the substrate 914 in the following manufacturing processes due to the weak adhesion between the electrodes and the substrate 914 and may affect the performance of the solar cell 910. As such, an inspection process is used to eliminate unqualified solar cell 910, i.e., the solar cell with peeling electrode in this embodiment. The inspection system 100 and its inspection method in this embodiment can precisely and quickly inspect if the solar cell 910 has a peeling three-dimensional pattern 912.

Figure 2:
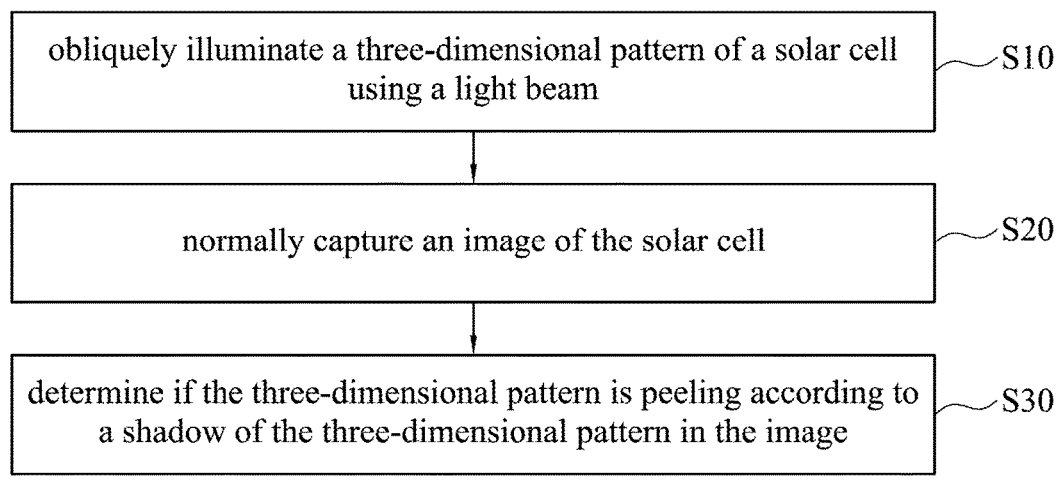
FIG. 2 is a flow chart of an inspection method according to one embodiment of the present disclosure.

FIG. 2 is a flow chart of an inspection method according to one embodiment of the present disclosure. The inspection method is configured to inspect the peeling state of the three-dimensional pattern 912, i.e., the electrode in this embodiment, of the solar cell 910. Reference is made to FIGS. 1 and 2. As shown in step S10, the light beam 112 is obliquely illuminated to the three-dimensional pattern 912 of the solar cell 910. Reference is made to FIG. 1. Since the three-dimensional pattern 912 protrudes from the substrate 914, the shadow 922 of the three-dimensional pattern 912 is on the left hand side of the three-dimensional pattern 912 in FIG. 1 when the light beam 112 illuminates the three-dimensional pattern 912 from the right hand side of FIG. 1.

Subsequently, as shown in step S20, an image of the solar cell 910 is normally captured. In this embodiment, the capturing device 120 can be disposed right above the solar cell 910, so that the capturing device 120 can normally capture the image of the solar cell 910. In other embodiments, however, the capturing device 120 may not be disposed right above the solar cell 910. Instead, a guiding element, e.g., a reflector or a dichroic mirror, may be disposed right above the solar cell 910 to guide the image of the solar cell 910 to the capturing device 120. An embodiment falls within the scope of the present disclosure if the light path L of the capturing device 120 for receiving light is perpendicular or substantially perpendicular to the inspecting surface 900, i.e., the light path L and the normal line N form an angle that is smaller than 30 degrees.

Figure 3A:
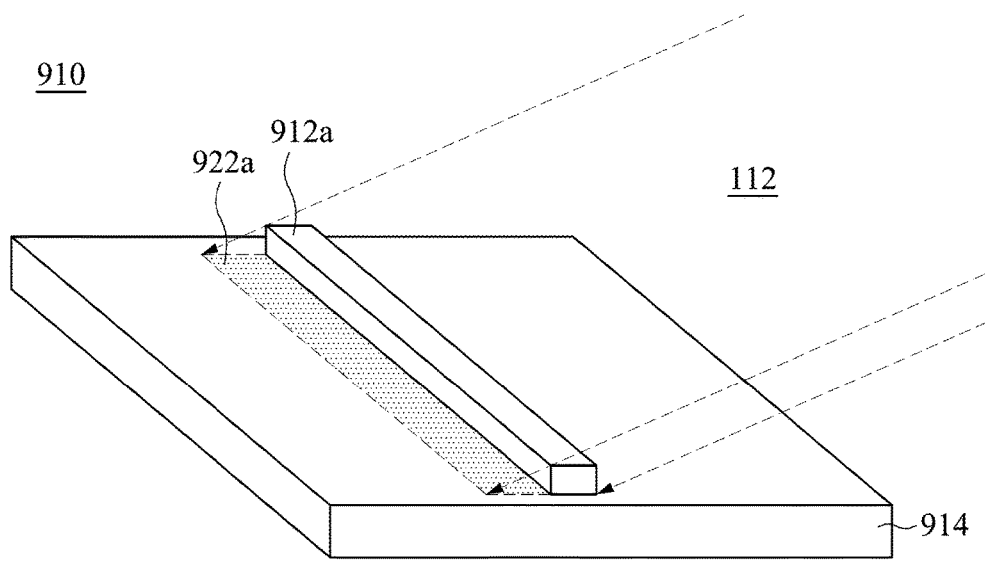
FIG. 3A is a perspective view of the solar cell and the light beam according to one embodiment of the present disclosure.
Figure 3B:
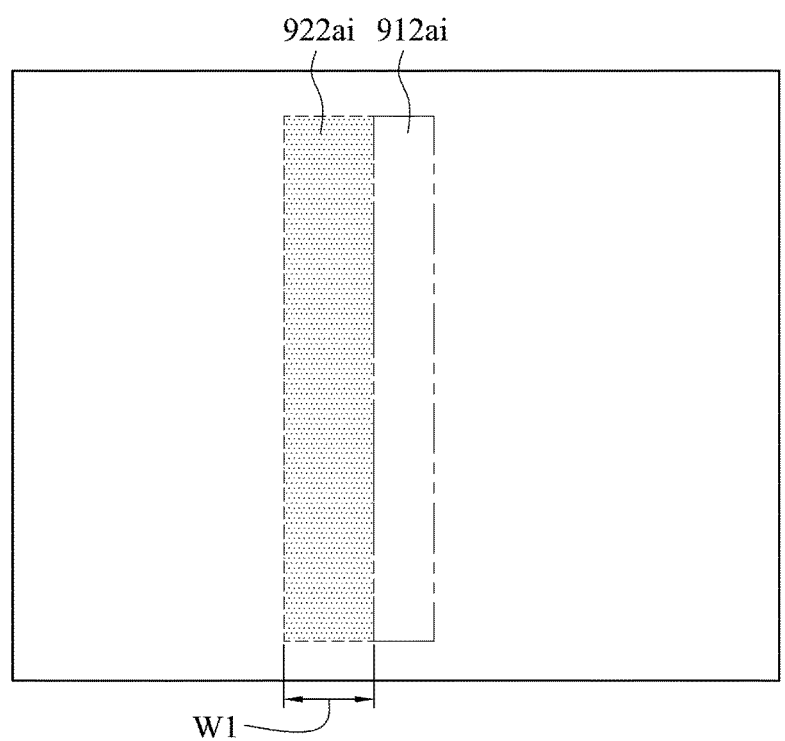
FIG. 3B is an illustrative diagram of the image of the solar cell in FIG. 3A.

Then, as shown in step S30, determining if the three-dimensional pattern 912 is peeling according to the shadow 922 of the three-dimensional pattern 912 in the image. For example, reference is made to FIGS. 3A and 3B. FIG. 3A is a perspective view of the solar cell 910 and the light beam 112 according to one embodiment of the present disclosure, and FIG. 3B is an illustrative diagram of the image of the solar cell 910 in FIG. 3A. In FIG. 3A, the three-dimensional pattern 912a of the solar cell 910 is completely adhered on the substrate 914. As such, the shadow 922a of the three-dimensional pattern 912a is straight when the three-dimensional pattern 912a is straight. That is, when an image 922ai of the shadow 922a is straight, the corresponding three-dimensional pattern 912a is determined to be non-peeling, i.e., completely adhered to, from the substrate 914.

In some embodiments, the inspection method further includes increasing the intensity of the light beam 112 to increase the contrast between the image 912ai of the three-dimensional pattern 912a and the image 922ai of the shadow 922a in the image. For example, the inspection system 100 in FIG. 1 may further include an intensity modulating element 140 electrically connected to the light source 110 and configured to modulate the intensity of the light beam 112. Specifically, the three-dimensional pattern 912a is also in the capturing field of the capturing device 120 (see FIG. 1). Hence, the image 912ai of the three-dimensional pattern 912a is also shown in the image captured by the capturing device 120 (i.e., FIG. 3B). The image 912ai may interference the analysis of the image 922ai of the shadow 922a, so that the intensity of the light beam 112 may be increased to lighten the image 912ai and increase the contrast between the images 912ai and 922ai. Even, the image 912ai may be overexposed to emphasize and distinguish the image 922ai.

Figure 4A:
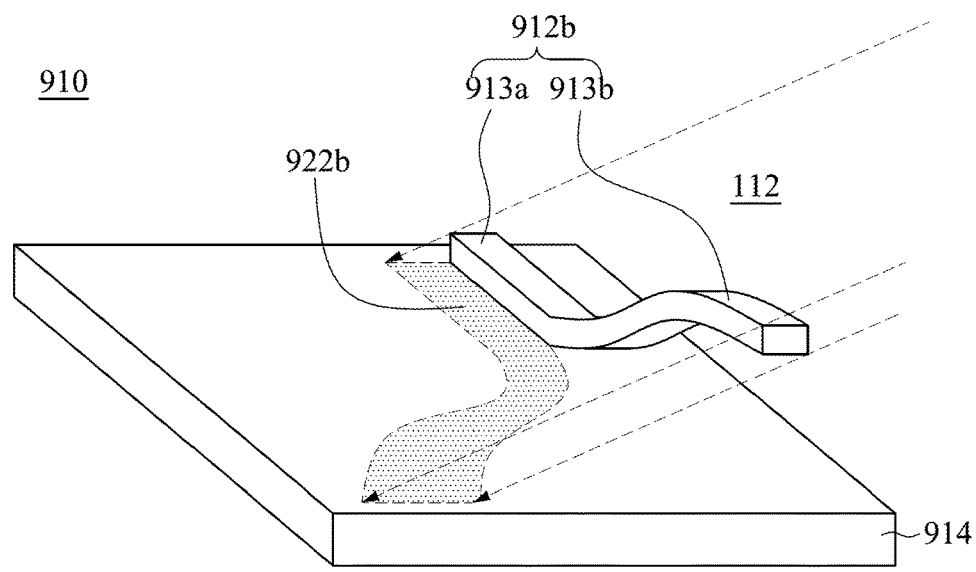
FIG. 4A is a perspective view of the solar cell and the light beam according to another embodiment of the present disclosure.
Figure 4B:
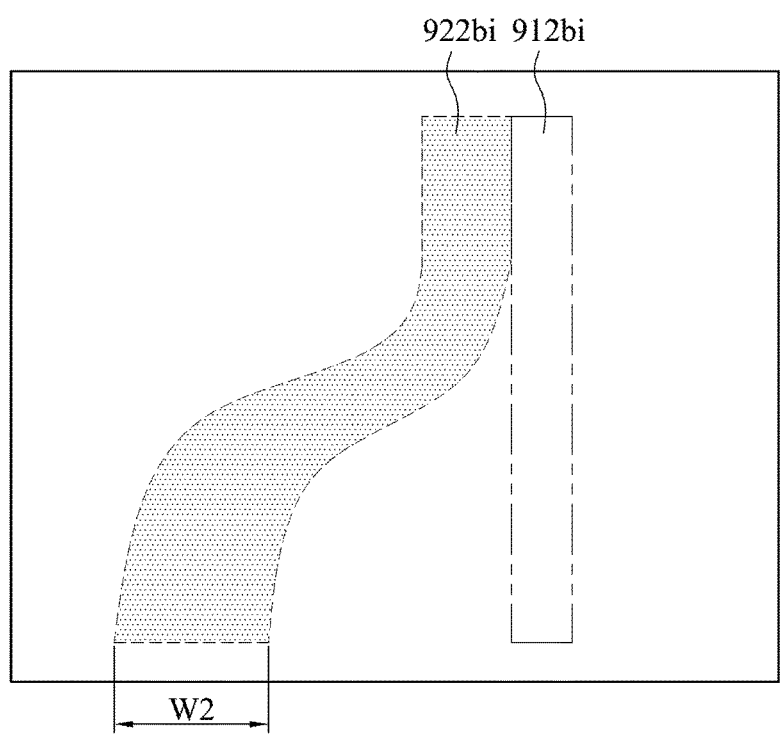
FIG. 4B is an illustrative diagram of the image of the solar cell of FIG. 4A.

FIG. 4A is a perspective view of the solar cell 910 and the light beam 112 according to another embodiment of the present disclosure, and FIG. 4B is an illustrative diagram of the image of the solar cell 910 of FIG. 4A. In FIG. 4A, the three-dimensional pattern 912b of the solar cell 910 is partially adhered on the substrate 914. Specifically, the three-dimensional pattern 912b includes an adhered portion 913a and a peeling portion 913b. The adhered portion 913a is adhered on the substrate 914, and the peeling portion 913b is peeled from the substrate 914. For example, the peeling portion 913b is suspended on the substrate 914 as shown in FIG. 4A. As such, the shadow 922b of the three-dimensional pattern 912b is curved. That is, when an image 922bi of the shadow 922b is curved, the corresponding three-dimensional pattern 912b is determined to be peeling, i.e., at least partially peeling. In this embodiment, the intensity of the light beam 112 can also be increased to increase the contrast between an image 912bi and the image 922bi.

Moreover, reference is made to FIGS. 3B and 4B. As shown in FIG. 4B, the image 922bi of the shadow 922b becomes wider when the corresponding three-dimensional pattern 912b is peeled from the substrate 914. In other words, a maximum width W2 of the image 922bi of the shadow 922b is greater than a maximum width W1 of the image 922ai of the shadow 922a. Hence, the inspection method of the present embodiment further includes measuring the widths W1 and W2 of the images 922ai and 922bi to determine if the three-dimensional patterns 912a and 912b are peeling. For example, the width W1 of the image 922ai of the shadow 922a of the predetermined unpeeled three-dimensional pattern 912a is obtained first. When an image is analyzed in the following process, the three-dimensional pattern may be peeling as long as the width of the corresponding shadow is greater than the width W1.

Figure 5A:
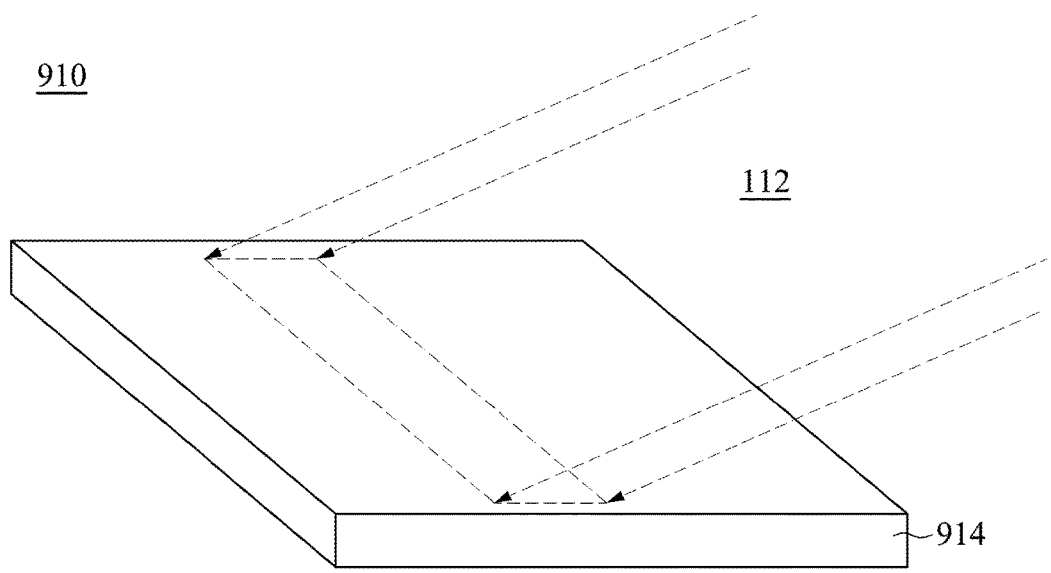
FIG. 5A is a perspective view of the solar cell and the light beam according to another embodiment of the present disclosure.
Figure 5B:
FIG. 5B is an illustrative diagram of the image of the solar cell of FIG. 5A.

FIG. 5A is a perspective view of the solar cell 910 and the light beam 112 according to another embodiment of the present disclosure, and FIG. 5B is an illustrative diagram of the image of the solar cell 910 of FIG. 5A. Reference is made to FIGS. 5A and 5B. In FIG. 5A, the three-dimensional pattern 912 (as shown in FIG. 1) is peeled from the substrate 914. As such, there is no shadow when the light beam 112 illuminates the solar cell 910, and the captured image has no image of the shadow. In other words, when there is no shadow in the image, the corresponding three-dimensional pattern 912 is determined to be peeling (completely peeling).

It should be noted that the solar cells 910 of the aforementioned embodiments including single three-dimensional pattern 912 are provided by way of example, and in some other embodiments, the solar cell 910 includes a plurality of three-dimensional patterns 912. As such, the shadows 922 of the three-dimensional patterns 912 can be individually inspected. In other words, the peeling of all the three-dimensional patterns 912 can be determined to obtain precise and fast inspection as long as one or few images are captured.

Figure 6A:
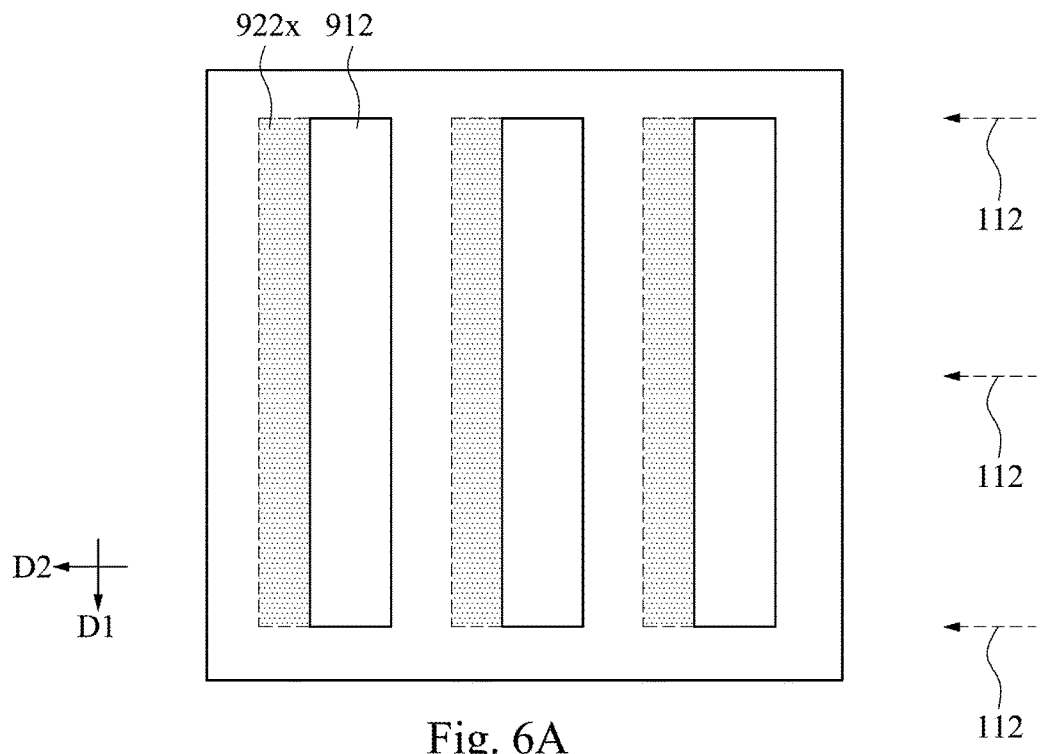
FIGS. 6A and 6B are top views of the solar cell at different orientations.
Figure 6B:
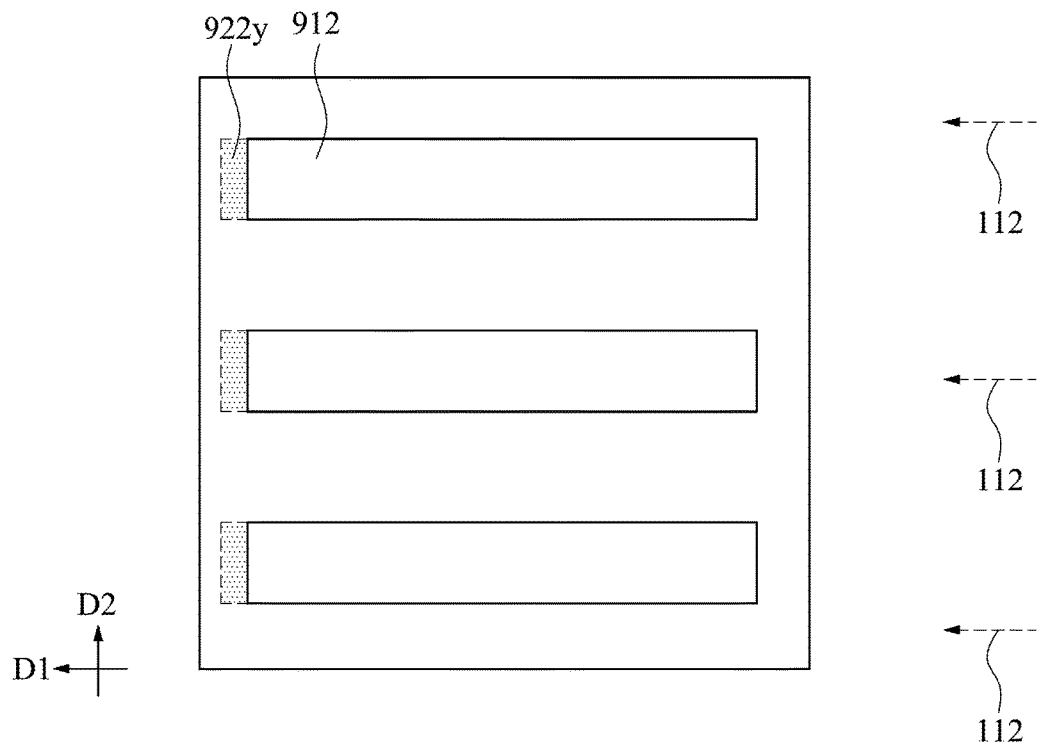

FIGS. 6A and 6B are top views of the solar cell 910 at different orientations. In FIG. 6A, the three-dimensional patterns 912 of the solar cell 910 extends along a first direction D1 and are arranged along a second direction D2 different from the first direction D1. The light beam 112 can illuminate the three-dimensional patterns 912 of the solar cell 910 along the second direction D2 to obtain shadows 922$x$ at this illuminating direction. Then, as shown in FIG. 6B, the solar cell 910 is rotated related to the light beam 112, e.g., the solar cell 910 is rotated about 90 degrees or the light beam 112 is rotated about 90 degrees, such that the light beam 112 illuminates the three-dimensional patterns 912 of the solar cell 910 along the first direction D1 to obtain the shadows 922$y$ at this illuminating direction. With these two directional shadows 922$x$ and 922$y$, the various peeling three-dimensional patterns 912 can be efficiently inspected.

Figure 7A:
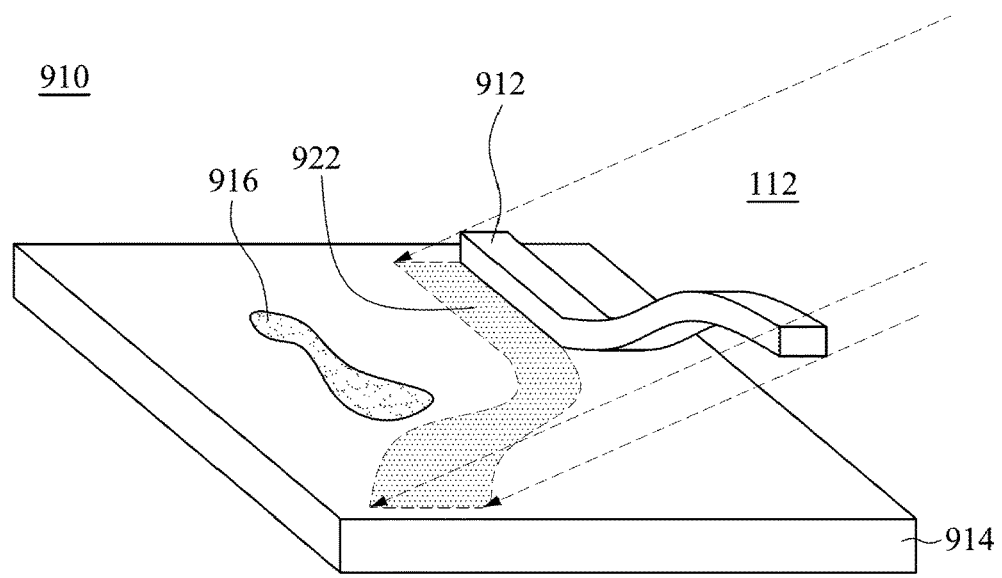
FIG. 7A is a perspective view of the solar cell and the light beam according to another embodiment of the present disclosure.
Figure 7B:
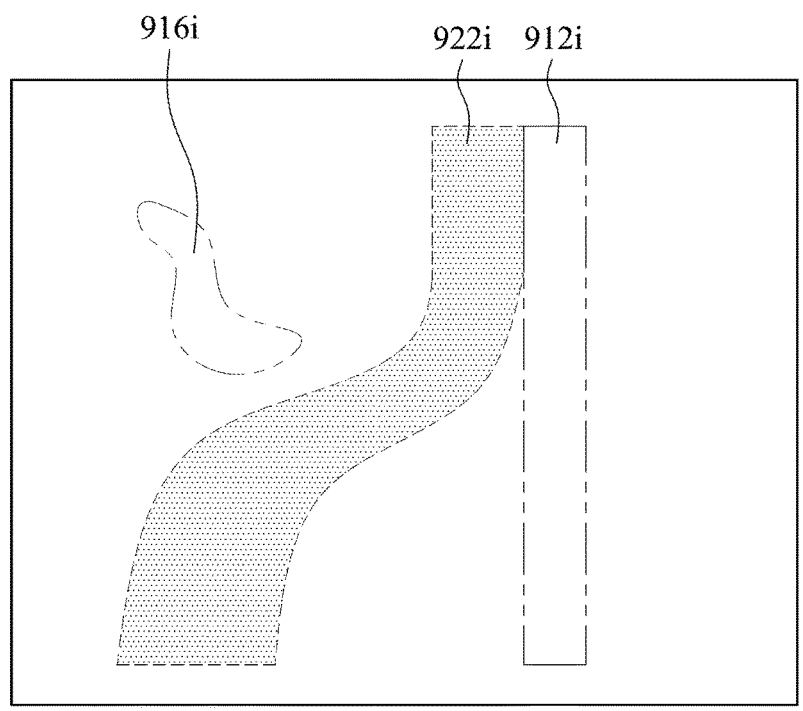
FIG. 7B is an illustrative diagram of the image of the solar cell of FIG. 7A.

FIG. 7A is a perspective view of the solar cell 910 and the light beam 112 according to another embodiment of the present disclosure, and FIG. 7B is an illustrative diagram of the image of the solar cell 910 of FIG. 7A. Reference is made to FIGS. 7A and 7B. In FIG. 7A, the solar cell 910 further includes an ink pattern 916. A conductive ink can be printed on the substrate 914 to form the electrodes during the manufacturing process of the electrodes of the solar cell 910, and the ink pattern 916 is a residue of the ink on the substrate 914. Since the ink pattern 916 and the three-dimensional pattern 912 are conductive materials, e.g., a material including metal, the optical properties thereof are similar. As such, the ink pattern 916 and the three-dimensional pattern 912 cannot be distinguished in the image under the illumination of regular inspection devices. However, the ink pattern 916 has a height much lower than the three-dimensional pattern 912, i.e., the ink pattern 916 is almost a plane (2D) pattern. Hence, when the light beam 112 illuminates the ink pattern 916, only the three-dimensional pattern 912 has the shadow 922, and the ink pattern 916 barely has a shadow, or the shadow size of the ink pattern 916 is much smaller than the resolution of the capturing device 120, so the capturing device 120 can only take the image of the shadow 922.

Moreover, the inspection method may further include increasing the intensity of the light beam 112. As mentioned above, since the ink pattern 916 and the three-dimensional pattern 912 include metals, they have high reflectivity to increase the contrast between the images of the ink pattern 916 and the shadow 922. Hence, the image 916$i$ of the ink pattern 916 and the image 912$i$ of the three-dimensional pattern 912 can be overexposed when the capturing device 120 captures the image, and the image 922$i$ of the shadow 922 can be easily distinguished. Therefore, the inspection method and the inspection device of the present embodiment not only can quickly and precisely determine if the three-dimensional pattern 912 is peeling, but also can remove the interference of the ink pattern 916 to increase the precision of the inspection.

In some embodiments, the inspection method further includes collimating the light beam 112 to be parallel light to illuminate the three-dimensional pattern 912 of the solar cell 910. Specifically, the parallel light can generate the shadow 922 of the three-dimensional pattern 912, and can avoid the shadow 922 from deformation because of the expansion of the light beam 112. The term "parallel light" as used herein means the light beam 112 has an expansion angle as the illumination distance increases, and the expansion angle is smaller than 10 degrees. In some other embodiments the expansion angle is smaller than 5 degrees. In some embodiments, the light source 110 of FIG. 1 is a parallel light source.

In summary, since the inspection method and the inspection system of the aforementioned embodiments inspect the shadow of the three-dimensional pattern, e.g., the shadow existence, the shape of the shadow, and/or the width of the shadow, to determine if the three-dimensional pattern is peeling, plural three-dimensional patterns can be quickly and precisely analyzed in a short time. Moreover, by increasing the intensity of the light beam, the images except the image of the shadow, such as the image of the three-dimensional pattern itself and the image of the ink pattern, can be removed to highlight the image of the shadow. As such, the accuracy of the analysis can be increased and also the ink signal can be removed.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A method for inspecting a solar cell, the method configured to inspect a peeling state of a three-dimensional pattern of the solar cell, the solar cell further comprising an ink pattern, the method comprising:
    obliquely illuminating the three-dimensional pattern of the solar cell using a light beam from a light source;
    normally capturing an image of the solar cell by using a capturing device;
    increasing an intensity of the light beam by using an intensity modulating element electrically connected to the light source to increase a contrast between the three-dimensional pattern and a shadow of the three-dimensional pattern in the image and increase a contrast between the ink pattern and the shadow in the image to overexpose the ink pattern in the image; and
    determining if the three-dimensional pattern is peeling by using an analyzing device electrically connected to the capturing device according to the shadow of the three-dimensional pattern in the image, when the shadow of the three-dimensional pattern in the image is curved, the three-dimensional pattern is peeling, and wherein when the shadow of the three-dimensional pattern in the image is straight, the three-dimensional pattern is non-peeling.

2. The method of claim 1, further comprising collimating the light beam to be a parallel light to illuminate the three-dimensional pattern of the solar cell.

3. An inspection system of a solar cell, comprising:
    a light source configured to provide a light beam to obliquely illuminate an inspecting surface;
    a capturing device configured to normally capture an image of the solar cell on the inspecting surface;
    an intensity modulating element electrically connected to the light source, wherein the intensity modulating element is configured to modulate an intensity of the light beam, such that a contrast between a three-dimensional pattern of the solar cell and a shadow of the three-dimensional pattern in the image is increased and a contrast between an ink pattern of the solar cell and the shadow of the three-dimensional pattern in the image is increased to overexpose the ink pattern in the image; and an analyzing device electrically connected to the capturing device, wherein the analyzing device is configured to determine if the three-dimensional pattern of the solar cell is peeling according to the shadow of the three-dimensional pattern in the image, when the shadow of the three-dimensional pattern in the image is curved, the three-dimensional pattern is peeling, and wherein when the shadow of the three-dimensional pattern in the image is straight, the three-dimensional pattern is non-peeling.

4. The inspection system of claim 3, wherein the light source is a parallel light source.

* * * * *